(12) United States Patent  
Ogasawara et al.

(10) Patent No.: US 7,787,346 B2  
(45) Date of Patent: *Aug. 31, 2010

(54) HOLOGRAM RECORDING METHOD AND DEVICE, HOLOGRAM REPRODUCTION METHOD AND DEVICE, AND OPTICAL RECORDING MEDIUM

(75) Inventors: Yasuhiro Ogasawara, Kanagawa (JP); Jiro Minabe, Kanagawa (JP); Shin Yasuda, Kanagawa (JP); Katsunori Kawano, Kanagawa (JP); Kazuhiro Hayashi, Kanagawa (JP); Koichi Haga, Kanagawa (JP); Hisae Yoshizawa, Kanagawa (JP); Makoto Furuki, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 475 days.

This patent is subject to a terminal disclaimer.

(21) Appl. No.: 11/808,711

(22) Filed: Jun. 12, 2007

(65) Prior Publication Data

US 2008/0151734 A1    Jun. 26, 2008

(30) Foreign Application Priority Data

Dec. 22, 2006  (JP)  .............................. 2006-345736

(51) Int. Cl.  
*G11B 7/00*  (2006.01)

(52) U.S. Cl. ................ 369/103; 369/112.1; 369/112.15; 359/22; 359/29; 365/216

(58) Field of Classification Search .................. None  
See application file for complete search history.

(56) References Cited

U.S. PATENT DOCUMENTS

| | | | |
|---|---|---|---|
| 5,610,897 A * | 3/1997 | Yamamoto et al. ..... 369/124.03 |
| 5,736,958 A * | 4/1998 | Turpin ........................ 342/179 |
| 6,697,316 B2 | 2/2004 | Burr | |
| 2002/0015376 A1* | 2/2002 | Liu et al. ..................... 369/103 |
| 2002/0145773 A1 | 10/2002 | Tanaka et al. | |
| 2004/0029038 A1 | 2/2004 | Minabe et al. | |
| 2004/0042374 A1 | 3/2004 | Horimai | |
| 2004/0212859 A1* | 10/2004 | Tsukagoshi .................. 359/15 |

(Continued)

FOREIGN PATENT DOCUMENTS

JP    A 2003-178460    6/2003

(Continued)

OTHER PUBLICATIONS

Sep. 2, 2009 Office Action issued in U.S. Appl. No. 11/604,342.

*Primary Examiner*—Joseph H Feild  
*Assistant Examiner*—Ifedayo Iluyomade  
(74) *Attorney, Agent, or Firm*—Oliff & Berridge, PLC (57) ABSTRACT

There is provided a hologram recording method, including generating a signal light which is spatially modulated such that digital data is represented by an image of intensity distribution, irradiating the signal light on an optical recording medium after a Fourier transformation of the signal light such that a zero-order component of the signal light comes into focus at a point removed from the optical recording medium, forming a diffraction grating in the optical recording medium by interference between the zero-order component of the signal light and a high-order component thereof, and recording digital data represented by the signal light as a hologram.

5 Claims, 10 Drawing Sheets

U.S. PATENT DOCUMENTS

2007/0236763 A1 * 10/2007 Minabe et al. .................. 359/1

FOREIGN PATENT DOCUMENTS

| JP | B2-3452113 | 7/2003 |
| JP | A 2004-059897 | 2/2004 |
| JP | A-2005-122867 | 5/2005 |
| JP | A 2005-215381 | 8/2005 |
| JP | A 2006-220933 | 8/2006 |

* cited by examiner

HOLOGRAM RECORDING METHOD AND DEVICE, HOLOGRAM REPRODUCTION METHOD AND DEVICE, AND OPTICAL RECORDING MEDIUM

CROSS-REFERENCE TO RELATED APPLICATIONS

This application is based on and claims priority under 35 USC 119 from Japanese Patent Application No. 2006-345736 filed Dec. 22, 2006.

BACKGROUND

1. Technical Field

The present invention relates to a hologram recording method, a hologram recording device, a hologram reproduction method, a hologram reproduction device, and an optical recording medium.

2. Related Art

In a holographic data storage, binary digital data of "0, 1" is changed to a digital image (signal light) as an image of intensity distribution, and, after a Fourier transformation of the signal light, the signal light is irradiated on a optical recording medium. Thus, a Fourier transformed image is recorded on the optical recording medium as a hologram.

A digital pattern of the signal light is generated by modulating a coherent light beam by a spatial light modulator.

Moreover, the signal light generated in the spatial light modulator includes a zero-order light (zero-order component) having same wave front at any time without depending on spatial modulation, and a diffraction light (a high-order component) corresponding to the spatial modulation.

SUMMARY

An aspect of the invention provides a hologram recording method, including: generating a signal light that is spatially modulated such that digital data is represented by an image of intensity distribution; irradiating the signal light on an optical recording medium after a Fourier transformation of the signal light is performed such that a zero-order component of the signal light comes into focus at a point removed from the optical recording medium; forming a diffraction grating in the optical recording medium by interference between the zero-order component of the signal light and a high-order component thereof; and recording digital data represented by the signal light as a hologram.

BRIEF DESCRIPTION OF THE DRAWINGS

Exemplary embodiment of the present invention will be described in detail based on the following drawings, wherein.

DETAILED DESCRIPTION

Hereinafter, one example of an embodiment according to the present invention will be explained in detail, referring to the drawings.

(Hologram Recording/Reproduction Device)

Figure 1:
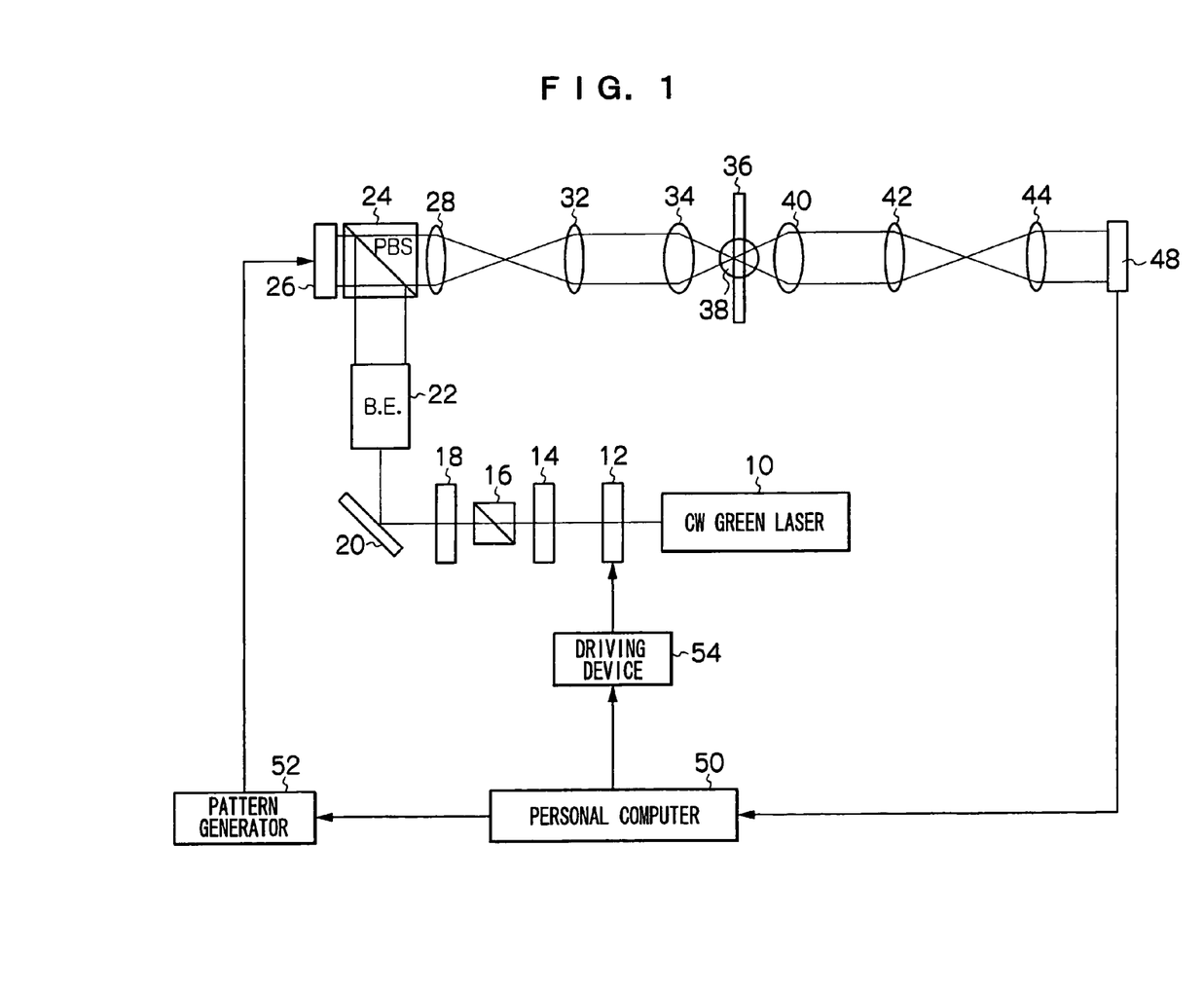
FIG. 1 is a view showing a schematic configuration of a hologram recording/reproduction device according to an exemplary embodiment of the present invention.

FIG. 1 is a view showing a schematic configuration of a hologram recording/reproduction device according to an exemplary embodiment of the present invention. The hologram recording/reproduction device is provided with a light source 10 which continuously oscillates a coherent laser light. A shutter 12 for shielding a laser light is arranged at the laser light irradiation side of the light source 10 in a manner that the shutter 21 may be inserted into, or retracted from the light path. The shutter 12 is driven by a driving device 54, based on a control signal from a computer 50.

On the light transmitting side of the shutter 12, a half-wave plate 14, a polarizing beam splitter 16, and a half-wave plate 18 are arranged in this order. A mirror 20 is arranged at the light transmitting side of the half-wave plate 18 to change the light path of the laser light. A beam expander 22, by which an incident beam is collimated to a larger diameter beam, is arranged at the light reflection side of the mirror 20.

A polarizing beam splitter 24, which transmits only a light polarized in a predetermined direction, is arranged at the light transmitting side of the beam expander 22. A reflection-type spatial light modulator 26 is arranged at the light reflection side of the polarizing beam splitter 24. The spatial light modulator 26 is connected to the personal computer 50 through a pattern generator 52.

The pattern generator 52 generates a pattern to be displayed on the spatial light modulator 26 according to digital data supplied from the personal computer 50. The spatial light modulator 26 modulates the incident laser light based on the display pattern to generate a digital image (signal light) for each single page of a hologram. Further, as described later, when a hologram is reproduced, a zero-order light for reproduction of the hologram is generated by reflecting the laser light with no modulation. Hereinafter, the zero-order light for reproduction may be also referred to as "reading light". The generated signal light or the reading light is reflected in a direction of the polarizing beam splitter 24 and pass through the polarizing beam splitter 24.

Relay lenses 28 and 32 are arranged at the light transmitting side of the polarizing beam splitter 24. A Fourier transform lens 34 for irradiating the signal light or the reading light to an optical recording medium 36 which is held on a stage 38 is arranged at the light transmitting side of the lens 32. Here, the optical recording medium 36 is a transmission-type recording medium formed in a plate shape. The optical recording medium 36 may be formed by molding, into plate shape, a recording material such as a photopolymer or an azopolymer, having a refractive index and the like that changes according to intensities of irradiated light, and forms a diffraction grating. Further, the optical recording medium 36 may be provided by forming a recording layer made of the above recording material, on a transparent plate-shape substrate.

When reproducing a hologram, a reading light irradiated on the optical recording medium 36 is diffracted by the hologram, and the diffraction light is emitted from the optical recording medium 36. Therefore, a Fourier transform lens 40 and relay lenses 42 and 44 are arranged at the diffraction-light emitting side of the optical recording medium 36. A light detector 48 is arranged at the light transmitting side of the Fourier transform lens 40. The light detector 48 includes a sensor array such as a charge coupled device (CCD) or a complementary metal oxide semiconductor (CMOS) sensor array which converts the received diffraction light into an electric signal and outputs the electric signal. The light detector 48 is connected to the personal computer 50.

(Recording and Reproduction Operation)

Figure 2:
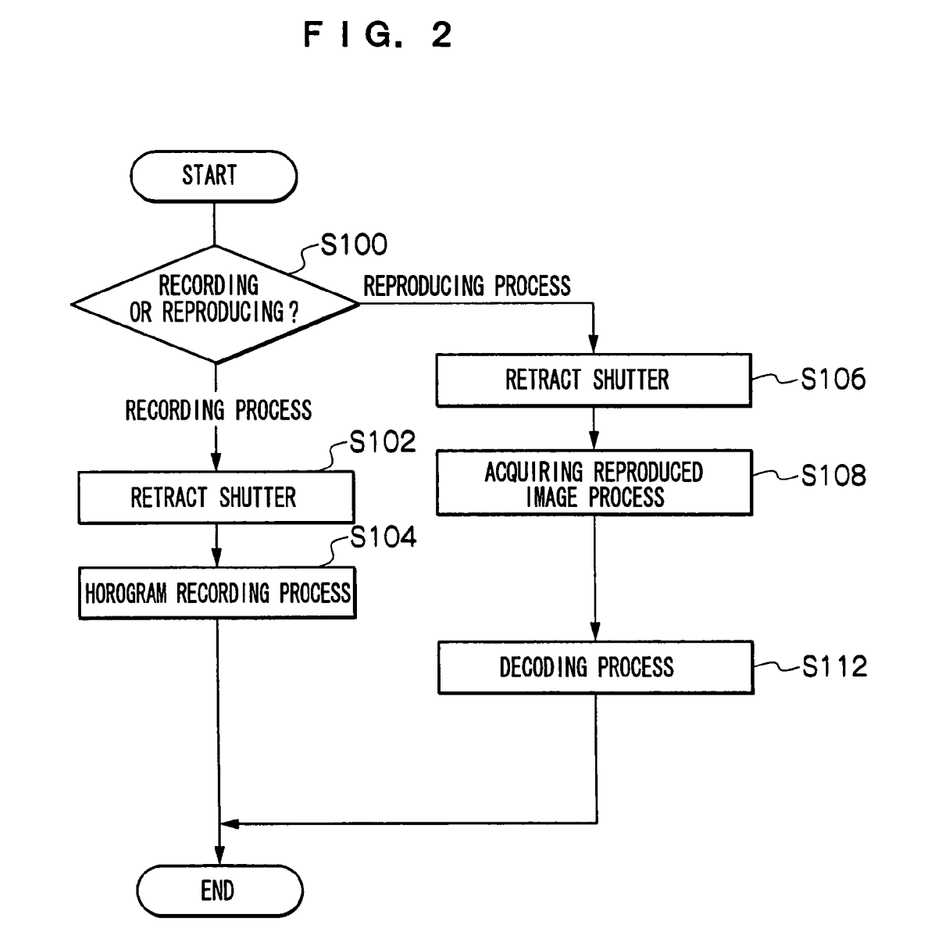
FIG. 2 is a flow chart showing a processing routine for recording/reproduction processing.

Next, a processing routine for recording/reproduction processing executed by the personal computer 50 will be explained. FIG. 2 is a flow chart showing the processing routine for recording/reproduction processing. Firstly, a user operates an input device (not shown) to select either recording processing or reproduction processing to be performed.

(1) Recording Processing of a Hologram

At step 100, it is determined that which of the processing, the recording processing or the reproduction processing, is selected. When it is determined that the recording processing is selected, the shutter 12 is retracted by the driving device 54 at step 102 to allow a laser light passing through. At the subsequent step 104, the laser light is irradiated from the light source 10, digital data is output from the personal computer 50 at a predetermined timing, the recording processing of a hologram is executed, and the routine is terminated.

Here, the recording processing of a hologram will be explained. The light amount of a laser light oscillated from the light source 10 is adjusted by the half-wave plate 14 and the polarizing beam splitter 16, and the laser light is adjusted by the half-wave plate 18 to form a polarized light which is polarized in a predetermined direction (a light polarized in a perpendicular direction in FIG. 1, i.e., s-polarization light), and then irradiated on the mirror 20. The laser light reflected by the mirror 20 incidents to the beam expander 22 and is collimated into a larger diameter beam. The collimated laser light incidents to the polarizing beam splitter 24, and is reflected in a direction of the spatial light modulator 26.

Figure 3:
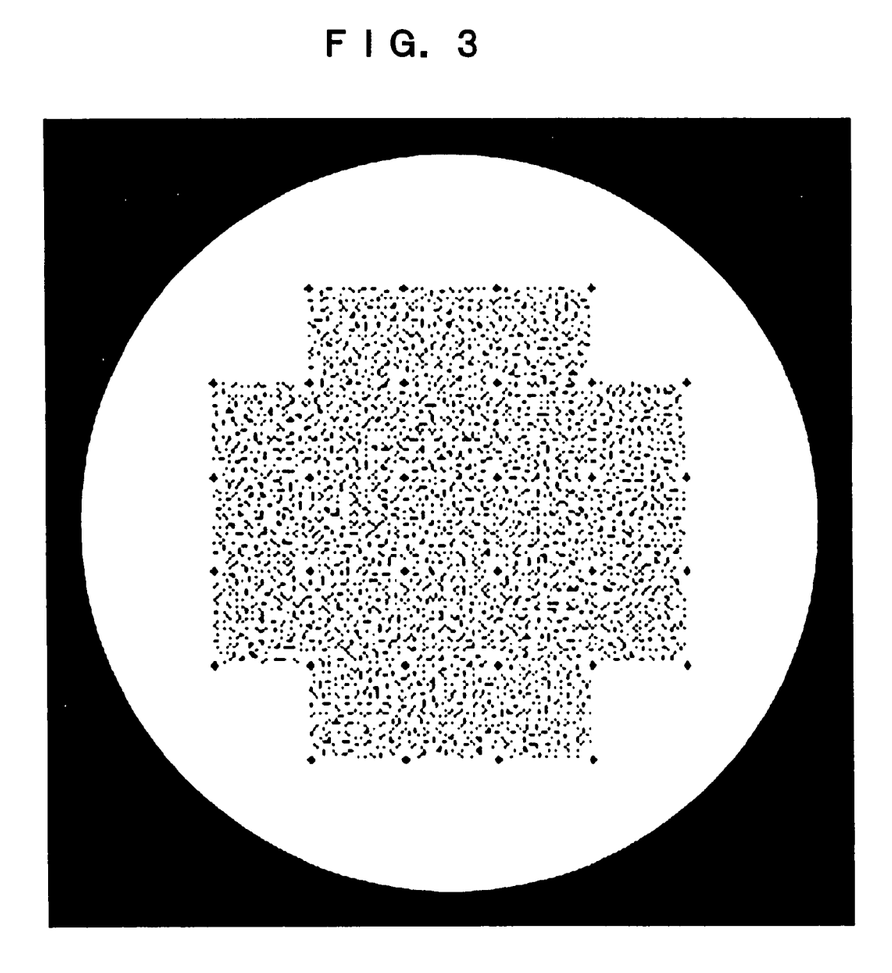
FIG. 3 is a view showing a signal light pattern displayed on a spatial light modulator.

When digital data is input from the personal computer 50 to the pattern generator 52, the pattern generator 52 generates a signal light pattern according to the supplied digital data. Thus, for example, a display pattern shown in FIG. 3 is displayed on the spatial light modulator 26. In the spatial light modulator 26, polarization of the polarized light is modulated based on the display pattern, and thereby a signal light is generated.

The signal light obtained by the modulation in the spatial light modulator 26 is irradiated on the polarizing beam splitter 24, and passes through the polarizing beam splitter 24 so that it is converted into an amplitude distribution of a linearly polarized light. Then, the signal light is relayed by the lenses 28 and 32, and is irradiated on the optical recording medium 36 after the Fourier transformation by the lens 34. Thereby, a high-order component and a zero-order component of the signal light interfere with each other in the optical recording medium 36, and a pattern obtained by the interference is recorded as a hologram.

In the present exemplary embodiment, the optical recording medium 36 is positioned as shown in FIG. 1 such that a focus position of the Fourier transform lens 34 is located outside of the optical recording medium 36. Thereby, the zero-order component of the signal light focuses at a point removed from (the outside of) the optical recording medium 36. Hereinafter, an arrangement in which the position of the optical recording medium 36 is shifted from the focus position is referred to as "defocus", and the details thereof will be described in the following.

(2) Reproduction Processing of a Hologram

When the reproduction processing is selected at the step 100 in FIG. 2, the shutter 12 is retracted by the driving device 54 at step 106 to allow the laser light passing through. At next step 108, processing for acquiring a reproduced image is initiated. That is, a laser light is irradiated from the light source 10 to execute the processing for acquiring a reproduced image.

Here, the processing for acquiring a reproduced image will be explained.

Figure 4:
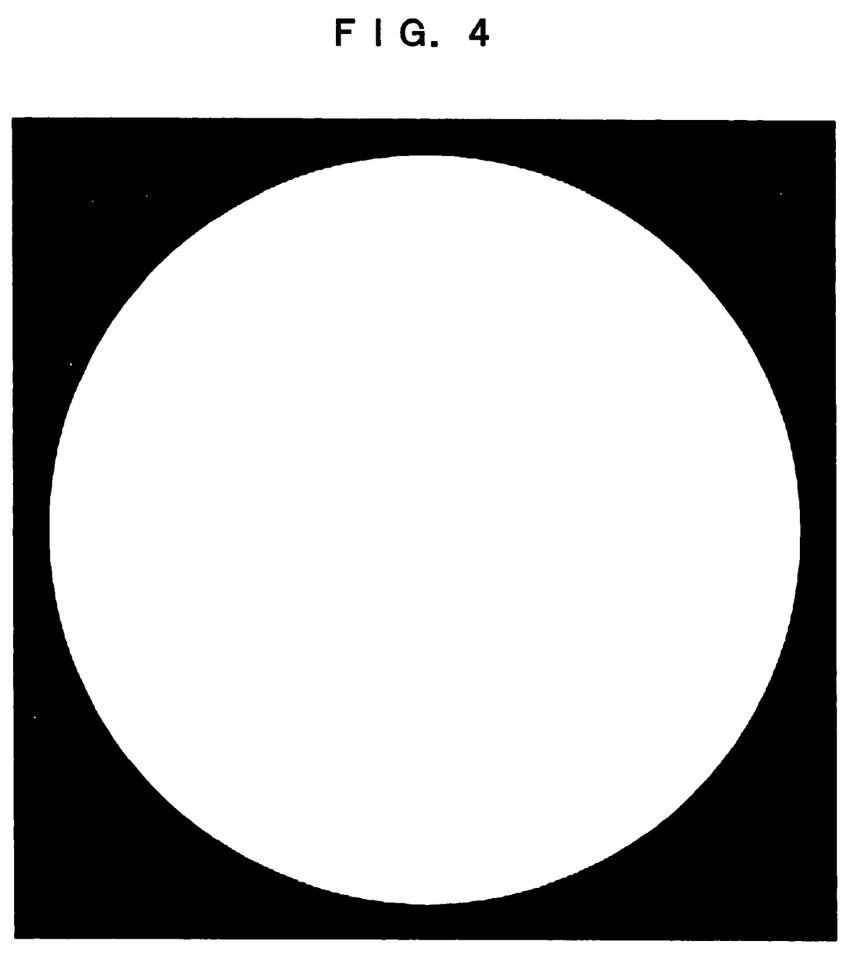
FIG. 4 is a view showing a reading light pattern displayed on the spatial light modulator.

A reading light pattern is displayed on the spatial light modulator 26 as shown in FIG. 4. Thereby, the laser light incident to the spatial light modulator 26 is reflected without modulation and generates a zero-order light for reproduction. The zero-order light passes through the polarizing beam splitter 24, and is irradiated on a region in which a hologram is recorded in the optical recording medium 36.

The irradiated zero-order light is diffracted by the hologram, and the diffraction light is emitted from the optical recording medium 36. The emitted diffraction light is relayed by the lenses 42 and 44 after an inverse Fourier transformation by the lens 40, and incidents to the light detector 48. A reproduced image can be observed on the focal plane of the lens 44. In the present exemplary embodiment, an image in which the intensity distribution thereof is reversed from that of the intensity distribution image of the signal light, is reproduced with a high signal to noise ratio. The reason why the reverse image is reproduced is that the zero-order component is removed from the signal light, and only the high-order component is reproduced.

The reproduced image can be detected by the light detector 48. An analog-to digital conversion with respect to the detected analog data is performed by the light detector 48, and image data of the reproduced image is input to the personal computer 50 and stored in a random access memory (RAM) (not shown) of the computer 50. The detected brightness (i.e., the image data) detected by each pixel of the light detector 48 is input to the personal computer 50 with correspondence to each pixel of the spatial light modulator 26.

When the processing for acquiring a reproduced image is completed at the step 108 in FIG. 2, the processing proceeds to the next step 110 in which the image data of the reproduced image stored in the RAM is read, and the processing proceeds to the next step 112. At the step 112, the original digital data is decoded from the image data. As the reproduced image is a reverse image in the present exemplary embodiment, reverse processing that reversing codes such as "0, 1" in the image data obtained from the reverse image is executed to decode the original digital data. In this way, the digital data stored in the signal light can be decoded accurately.

(Defocus Recording)

As described above, in the present exemplary embodiment, a hologram is recorded in a defocus state, in which the position of the optical recording medium 36 is shifted away from the focus position of the Fourier transform lens 34. Now, the significance of the defocus will be explained.

Figure 10:
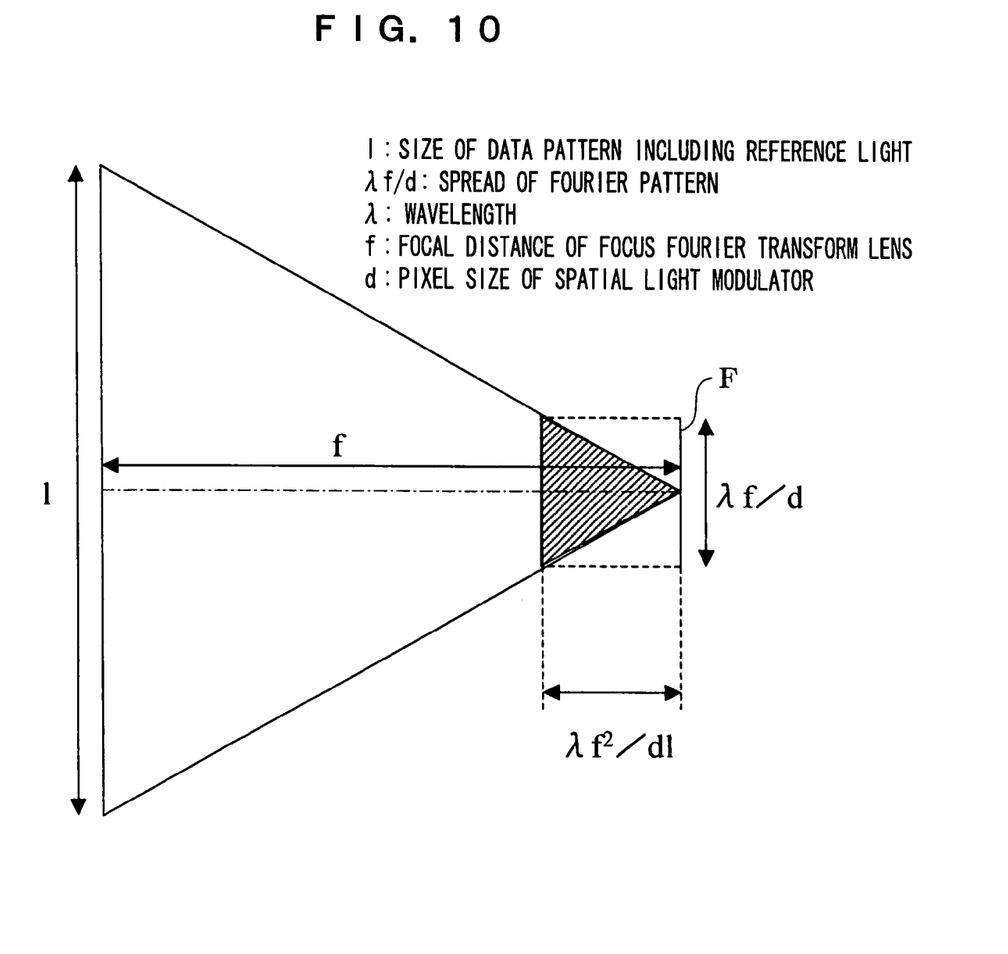
FIG. 10 is a view showing a relation between the spread of a zero-order component of the signal light and a high-order component of the signal light.

FIG. 10 is a view showing a relation between the spread of the zero-order component and the high-order component of the signal light. The data pattern of the signal light comes into focus at the focus plane F of the Fourier transform lens as shown by dotted lines. The data pattern includes a zero-order component and a high-order component, and, the zero-order component comes into focus at the focus plane F of the Fourier transform lens as shown by the solid line.

Here, when the length of one side of the data pattern of the signal light before the Fourier transformation is l, the wave length of the signal light is λ, the focal distance of the Fourier transform lens is f, and the pixel size of the spatial light modulator (the length of one side of a pixel) is d, the spread of the Fourier pattern on the focal plane F is λf/d. The length l, the wave length λ, the focal distance f, and the length d are expressed using the same unit system. They may be expressed in units such as meters and micrometers.

The spread of the Fourier pattern within several mm from the focal plane F is substantially constant, and the size may be λf/d. Accordingly, the beam spread of the zero-order component becomes equal to the spread of the Fourier pattern at a position $\lambda f^2/dl$ away from the focal plane F. In the present exemplary embodiment, the zero-order component and the high-order component are configured to be interfered with each other at a position other than the focus position, at which the intensity of the zero-order component becomes the maximum, by realizing the defocus state. Recording and reproduction may be performed at a high signal to noise ratio by increasing a ratio of a high-order component to the zero-order component.

Figure 11A:
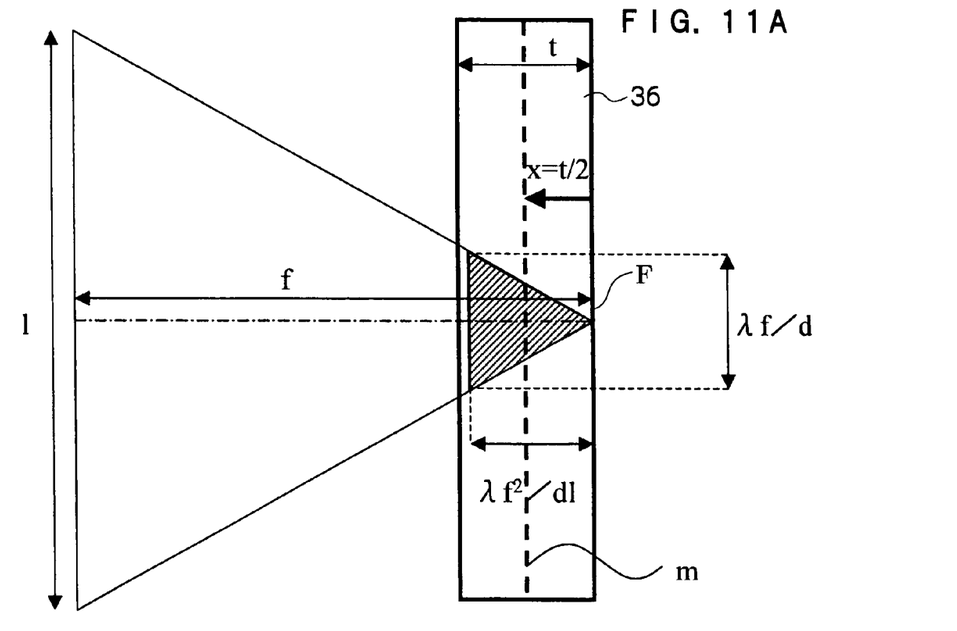
FIGS. 11A and 11B are views explaining a defocus amount.
Figure 11B:
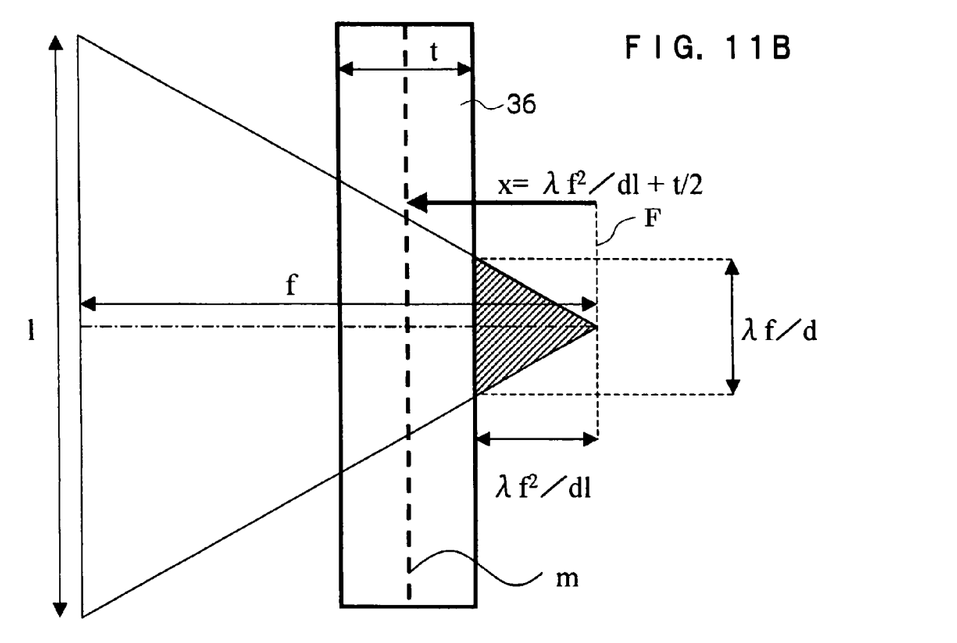

Next, details of the defocus amount will be explained referring to FIG. 11A and FIG. 11B. The focus position may be shifted either to light incident side or light emitting side with respect to the optical recording medium 36. Here, a case in which the optical recording medium 36 with a thickness of t is arranged at the side of the spatial light modulator 26 with respect to the focal plane F of the Fourier transform lens will be explained. The intermediate position of the optical recording medium 36 in the thickness direction is indicated by m. The defocus amount is a distance x from the focal plane F to the intermediate position m. Here, the whole optical recording medium in the present exemplary embodiment is formed by the recording material, and the dashed-dotted line represents the optical axis.

When the focal plane F exists inside of the optical recording medium 36, the zero-order component and the high-order component will be interfered with each other at the focus position, at which the intensity of the zero-order component becomes the maximum, and as a result the signal to noise ratio reduces. Therefore, the defocus amount x is required to be larger than t/2 as shown in FIG. 11A. On the other hand, when the spread of the beam of the zero-order component is more extensive than that of the Fourier pattern, the zero-order light irradiated on undesired region will be increased, and the intensity of the zero-order component also reduces. Thereby, the signal to noise ratio reduces. Therefore, the upper limit of the defocus amount may be set at a value of $\lambda f^2/dl+t/2$ as shown in FIG. 11B. That is, the defocus amount x may be set at a value within a range shown by the following expression (1).

$$t/2<|x|\leq \lambda f^2/dl+t/2 \tag{1}$$

Moreover, the defocus amount x may be set at a value within a range shown by the following expression (2) when it is the basic unit of digital data is plural pixels of the spatial light modulator 26, that is, the size of one pixel in the digital data is p (for example, p=3d).

$$t/2<|x|\leq \lambda f^2/pl+t/2 \tag{2}$$

Moreover, in order to effectively record the required spread of the Fourier pattern in a region in which the zero-order component intersects with the high-order component, the thickness t of the optical recording medium 36 may satisfies the following expression (3).

$$t>\lambda f^2/dl \tag{3}$$

When, for example, a optical recording medium with a thickness of 500 μm is used, and when the length of one side of the data pattern for a signal light before the Fourier transformation is 8.67 mm, the wave length of the signal light is 532 nm, the focal distance of the Fourier transform lens is 10 mm, and the size of one pixel in digital data is 38 μm, the defocus amount x may be within a range of 250 μm to 724 μm, and, more preferably, within a range of 250 μm to 408 μm, based on the above-described expression (2).

As explained above, according to the present exemplary embodiment, a hologram may be recorded in a manner that the Fourier transformation pattern of a zero-order light and that of a high-order light are interfered with each other, using a very simple method in which a signal light is Fourier transformed and irradiated on an optical recording medium such that the zero-order component of the signal light comes into focus at a point removed from the optical recording medium. Further, when reproducing the hologram recorded as described above by irradiating the zero-order light to the hologram, the signal light may be reproduced with a high signal to noise ratio without separating a zero-order light from the reproduced light.

Accordingly, even when a hologram is recorded by interference between the Fourier transformation pattern of the zero-order component and that of the high-order component of signal light, a recording medium with a special mechanism or a complex optics system to separate the zero-order light are not required. For example, there is no need to divide the recording medium into a zero-order light processing region and a diffraction light processing region as described in JP-A No. 2005-215381, in order to achieve increasing in an information amount per one record page and realize large volume recording.

Further, although an example using a reflection-type spatial light modulator has been explained in the above-described exemplary embodiment, a transmission-type spatial light modulator may be used to generate the signal light.

Moreover, although an example in which a reverse image is reproduced has been explained in the above-described exemplary embodiment, an image same as the image of intensity distribution representing the signal light may be reproduced when a photopolymer is used for a recording material.

EXAMPLES

Hereinafter, the present invention will be explained according to examples, but the present invention is not limited to the examples.

Example 1

An experiment is conducted using a device having a configuration same as the hologram recording/reproduction device shown in FIG. 1.

Continuous Wave Green Laser System "Verdi" (wave length: 532 nm) manufactured by Coherent Inc. is used for the light source 10. An LCD spatial light modulator "LCOS" (pixel: 1024 (width)×768 (height), pixel pitch: 19 μm (the pitch is reduced to 12.7 μm by relay lenses just before the Fourier transform lens), and display area: 19.6 mm×14.6 mm), manufactured by Holoeye Photonics AG, is used for the reflection-type spatial light modulator 26. A CMOS sensor array (pixel: 1280 (width)×1024 (height), pixel pitch: 6.7 μm, and image pick-up area: 8.6 mm×6.9 mm), manufactured by Lumenera Inc., is used for the light detector 48.

A high-aperture-ratio (NA) objective lens (NA: 0.6, and focal distance: 10 mm), is used for a microscope, and the like, is used for the Fourier transform lens 34 and 40. The ratio of the focal distance of the relay lens 28 32 is set at 1.5:1, and the ratio of the focal distance of the relay lens 42 and 44 is set at 1:1. A sheet-like azopolymer with a thickness of 500 μm is used for the optical recording medium 36. The structure of the used azopolymer is shown in the following chemical formula.

The above-described azopolymer is synthesized as a high-polymer material having a pigment (methylazobenzen) as a side chain by melt polycondensation, using 5-{6-[4-(4-methylphenylazo)phenoxy]hexyloxy}diethyl isophthalate and 5-{6-[4-(4-cyanophenyl)phenoxy]hexyloxy}diethyl isophthalate as a side chain monomer, and 6,6'-(4,4'-(sulfonyldiphenylenedioxy)dihexanol as a main chain monomer. In the chemical formula, x=0.3, y=0.7, and p=5 to 2000. The details of the synthesizing method are described in JP-A No. 2004-59897 corresponding to the U.S. patent application Ser. No. 10/454,690, which the whole text of these specifications is incorporated in the disclosure of the present specification by reference.

The optical recording medium 36 is arranged such that it is shifted toward the side of the spatial light modulator 26 by 350 μm from the focal plane of the Fourier transform lens 34. Here, the defocus amount is a distance of an intermediate position m in the thickness direction of the optical recording medium 36 from the focal plane as described above.

While 3×3 pixels of the spatial light modulator 26 are set to be one pixel that is constituting the digital data, a signal light pattern expressed by 2:9 modulation codes, expressing five bit data with nine pixels (of which one pixel is set as above), is displayed on the spatial light modulator 26 (refer to FIG. 3), and a laser light with a wave length of 532 nm is irradiated on the spatial light modulator 26 to generate a digital pattern of the signal light. The length of one side of the pixel forming the digital pattern is 57 μm (equals to three pixels of the space light modulator, and is reduced to 38 μm by the relay lens just before the Fourier transform lens). This signal light is irradiated on the optical recording medium 36 through the Fourier transform lens 34, and a Fourier transform image is recorded as a hologram.

Figure 5:
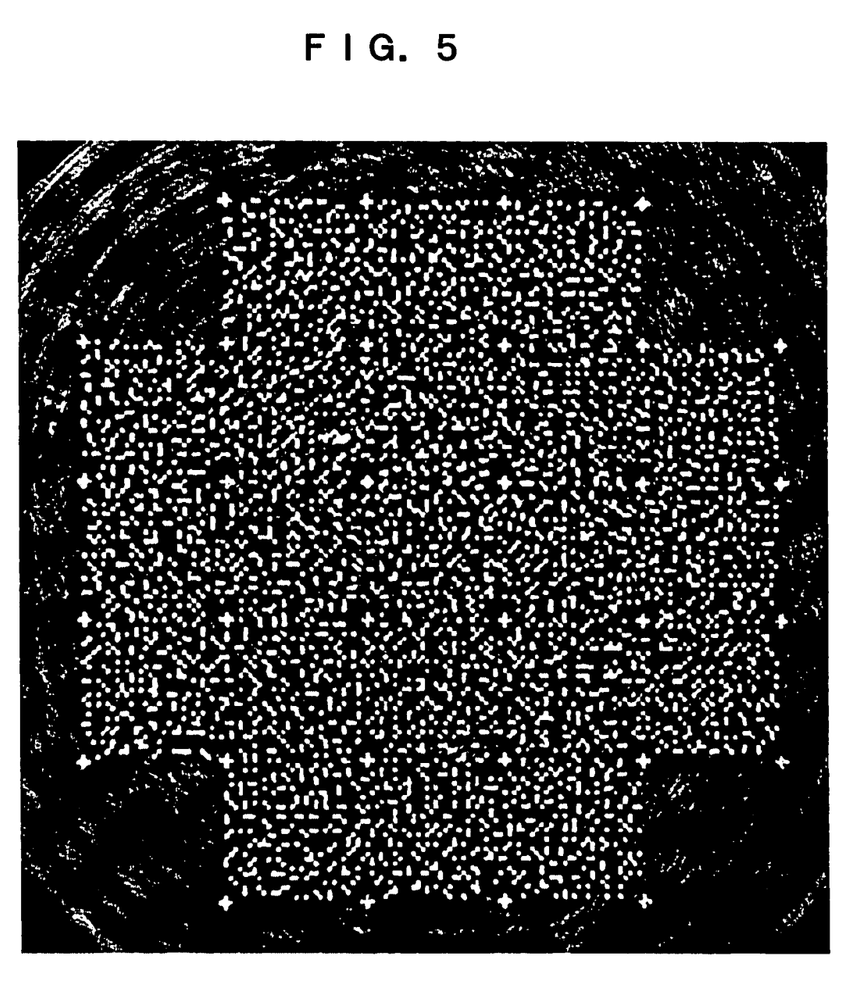
FIG. 5 is a view showing a reproduced image detected in an Example 1.

Next, a reading light patter (refer to FIG. 4) is irradiated on the recorded hologram, using a laser light with a wave length of 532 nm, and an inverse Fourier transformation of a reproduced diffraction light is performed by the Fourier transform lens 44, and the reproduced image, which focuses on the focal plane of the Fourier transform lens is detected by the light detector 48. A reverse image of the display pattern (FIG. 3) is reproduced as shown in FIG. 5.

Original digital data is decoded by reversing codes of image data of the reproduced image which is detected by the light detector 48. In this case, the bit error rate (BER) of the reproduced data is zero, and it is understood that a high signal to noise ratio is realized. Here, BER is a ratio of a number of generated error data to the decoded data.

Similar experiments are conducted by changing the defocus amount within a range of −950 μm to +950 μm, and BERs and signal to noise ratios are obtained from the decoded data. The results are shown below.

Figure 6:
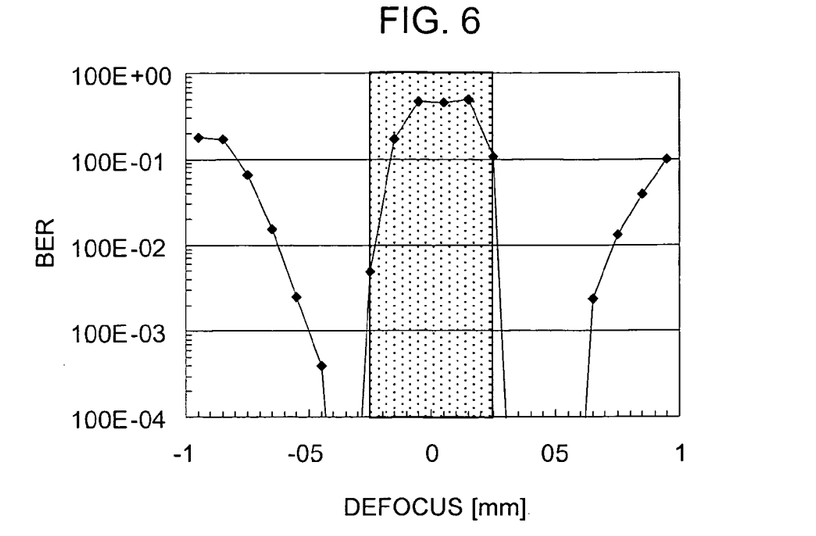
FIG. 6 is a view showing changes in BER for defocus amounts.
Figure 7:
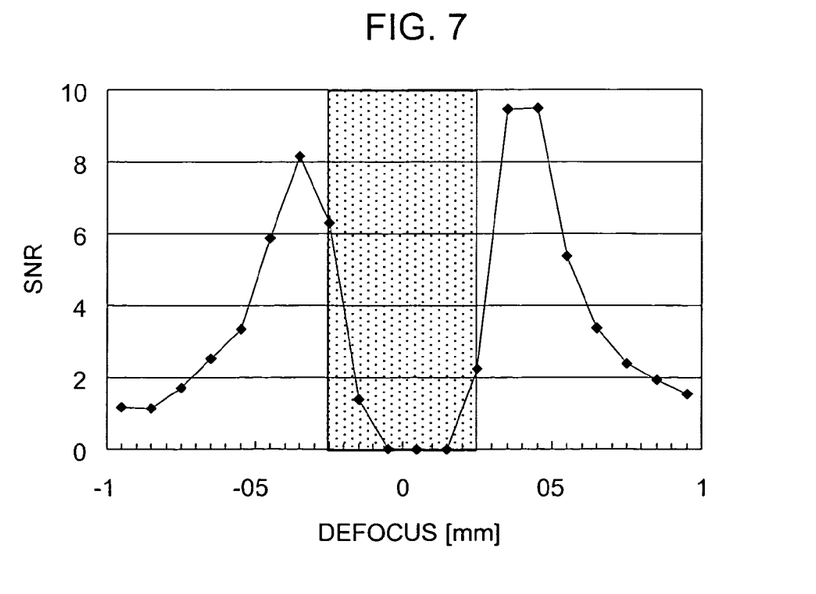
FIG. 7 is a view showing changes in SNR for defocus amount.

FIG. 6 is a view showing changes in the BER with respect to the defocus amounts, and FIG. 7 is a view showing changes in the defocus amount with respect to the BERs. The defocus amount represents a shift amount of the focus position of the Fourier transform lens 34 from the center position of the optical recording medium 36 in the thickness direction. In the drawings, a hatched region represents a region in which the focus position exists inside of the optical recording medium. As seen from FIG. 6 and FIG. 7, the signal to noise ratio is extremely decreased because the reverse image cannot be obtained when the focus position of the Fourier transform lens 34 exists within the optical recording medium 36. It is understood that both the BER and the signal-to-noise ratio S/N is improved when the focus position of the Fourier transform lens 34 exists within a predetermined range from the center position of the optical recording medium 36 in the thickness direction (both front and rear directions).

Example 2

Figure 8:
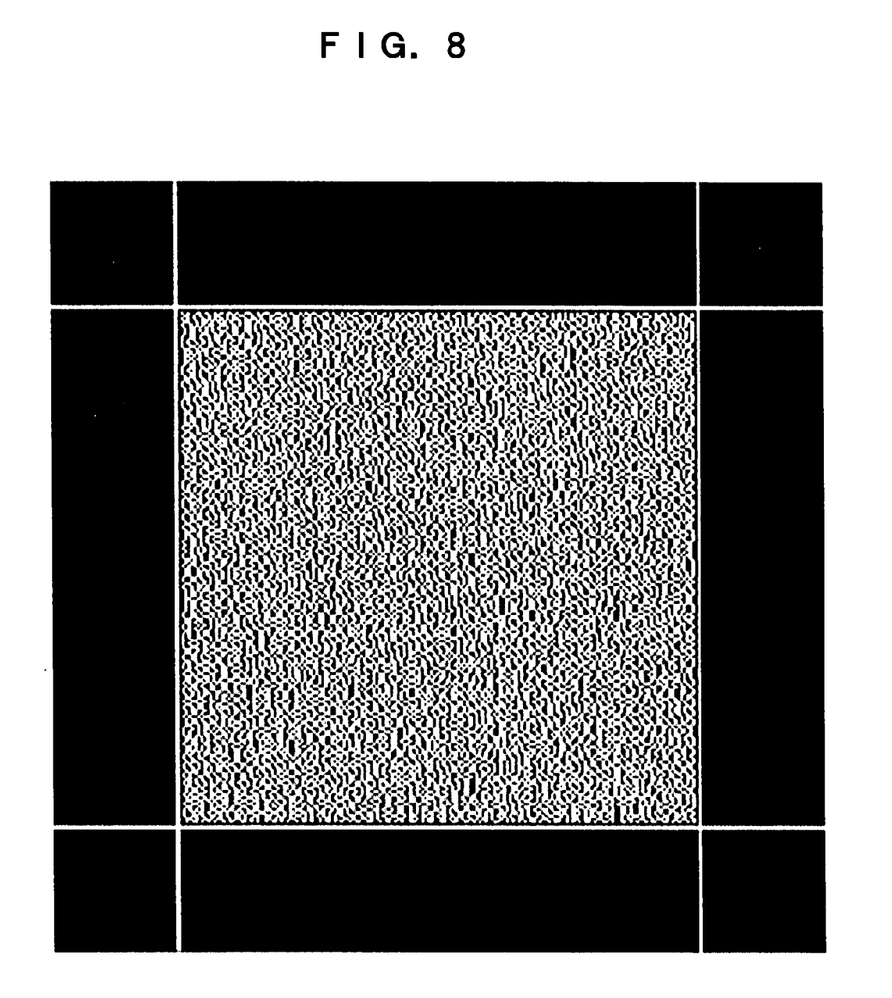
FIG. 8 is a view showing a signal light pattern used in Example 2.
Figure 9:
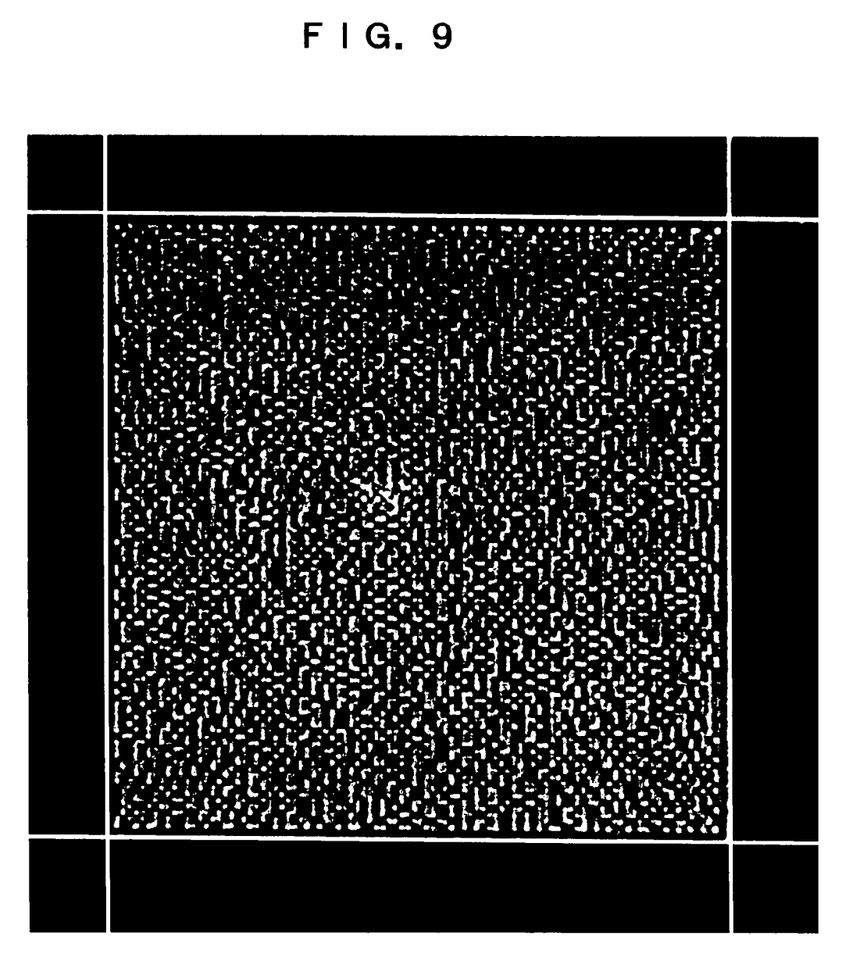
FIG. 9 is a view showing a reproduced image detected in the Example 2.

An experiment is conducted, using a sheet-like photopolymer with a thickness of 250 μm as the optical recording medium 36. A recording/reproduction device has a configuration same as that used in Example 1. Further, the defocus amount is set to be 250 μm. 3×3 pixels of the spatial light modulator 26 are set to be one pixel forming the digital data, and a signal light pattern expressed by differential coding expressing one bit data with the two pixels, is displayed on the spatial light modulator 26 (refer to FIG. 8). The data amount of the above signal light pattern is 329 bytes. As a result of the reproduction, a reproduced image of the display pattern (FIG. 8) is obtained as shown in FIG. 9. A bit error rate (BER) in this case is $2.23 \times 10^{-3}$. The BER value of $2.23 \times 10^{-3}$ indicates that, data of 329 bytes/one page is able to be recorded and reproduced with no errors by using a known error correction method such as a (7, 4) cyclic Hamming code. It is understood that a high signal to noise ratio is realized by performing recording in the defocus state even when an alternative recording material is used.

The foregoing description of the exemplary embodiments of the present invention has been provided for the purpose of illustration and description. It is not intended to be exhaustive or to limit the invention to the precise form disclosed herein. Obviously, many modifications and variations will be apparent to a practitioner skilled in the art. The exemplary embodiments were chosen and described in order to best explain the principles of the invention and its practical applications, thereby enabling others skilled in the art to understand the invention according to various embodiments and with various modifications as are suited to the particular use contemplated. It is intended that the scope of the invention be defined by the following claims and their equivalents.

What is claimed is:

1. A hologram recording method, comprising:
   generating a signal light that is spatially modulated such that digital data is represented by an image of intensity distribution;
   irradiating the signal light on an optical recording medium after a Fourier transformation of the signal light is performed such that a zero-order component of the signal light comes into focus at a point removed from the optical recording medium;
   forming a diffraction grating in the optical recording medium by interference between the zero-order component of the signal light and a high-order component thereof; and
   recording digital data represented by the signal light as a hologram, wherein
   a focus position of the zero-order component of the signal light that is separated by a distance x represented by the following expression (1) from an intermediate point of the optical recording medium in the thickness direction, $$t/2 < |x| \leq \lambda f^2/dl + t/2 \qquad (1),$$

wherein the length of one side of a rectangular pattern in the image of intensity distribution representing the signal light before the Fourier transformation is l, the wave length of the signal light is λ, the focal distance of a Fourier transform lens is f, the length of one side of each pixel in the image of intensity distribution is d, and the thickness of the optical recording medium is t, and the length l, the wave length λ, the focal distance f, the length d, the thickness t, and the distance x in the expression (1) are expressed using the same unit system.

2. A hologram recording device, comprising:
   an irradiation light source that irradiates a coherent light;
   a spatial light modulator in which a plurality of pixels are arranged that have passing therethrough, or that reflect, the coherent light irradiated from the irradiation light source, and the coherent light is modulated for each pixel by passing through or being reflected by the plurality of pixels;
   a controller that controls each pixel in the spatial light modulator such that the coherent light irradiated from the irradiation light source is spatially modulated according to digital data to generate a signal light representing the digital data as an image of intensity distribution; and
   an irradiator that irradiates the signal light on an optical recording medium after a Fourier transformation of the signal light generated by the spatial light modulator is performed such that a zero-order component of the signal light comes into focus at a point removed from the optical recording medium; and
   a focus position of the zero-order component of the signal light is separated by a distance x represented by the following expression (1) from an intermediate point of the optical recording medium in the thickness direction, $$t/2 < |x| \leq \lambda f^2/dl + t/2 \qquad (1), \text{ and}$$

wherein the length of one side of a rectangular pattern in the image of intensity distribution representing the signal light before the Fourier transformation is l, the wave length of the signal light is λ, the focal distance of a Fourier transform lens is f, the length of one side of each pixel in the image of intensity distribution is d, and the thickness of the optical recording medium is t, and the length l, the wave length λ, the focal distance f, the length d, the thickness t, and the distance x in the expression (1) are expressed using the same unit system.

3. A hologram reproduction method for reproducing digital data represented by a signal light from a hologram recorded by the hologram recording method of claim 1, the hologram reproduction method comprising:
   irradiating a zero-order light on the diffraction grating formed in the optical recording medium;
   detecting a reproduced light generated by diffraction from the diffraction grating;
   restoring the signal light by reversing the intensity distribution of the detected reproduced light; and
   reproducing digital data represented by the signal light.

4. A hologram reproduction device for reproducing digital data represented by a signal light from a hologram recorded by the hologram recording method of claim 1, the device comprising:
   a zero-order light irradiator that irradiates a zero-order light on the diffraction grating formed in the optical recording medium;
   a detector that detects a reproduced light generated by diffraction from the diffraction grating; and
   a restoring section that restores the signal light by reversing the intensity distribution of the detected reproduced light.

5. An optical recording medium on which digital data represented by a signal light is recorded as a hologram by the hologram recording method of claim 1.

* * * * *